United States Patent [19]
Keckley et al.

[11] Patent Number: 6,031,229
[45] Date of Patent: Feb. 29, 2000

[54] AUTOMATIC SEQUENCING OF FIB OPERATIONS

[75] Inventors: David M. Keckley, Castro Valley; Debra M. Yung, San Jose; Roger A. Nicholson, Fremont; Xavier Larduinat, Sunnyvale, all of Calif.

[73] Assignee: Schlumberger Technologies, Inc., San Jose, Calif.

[21] Appl. No.: 09/082,455

[22] Filed: May 20, 1998

[51] Int. Cl.[7] .................................................. H01J 37/304
[52] U.S. Cl. ................ 250/309; 250/492.21; 204/192.33
[58] Field of Search .............................. 250/492.21, 309; 216/59; 204/192.33

[56] References Cited

U.S. PATENT DOCUMENTS

| | | |
|---|---|---|
| 5,055,696 | 10/1991 | Haraichi et al. . |
| 5,140,164 | 8/1992 | Talbot et al. . |
| 5,395,769 | 3/1995 | Arienzo et al. . |
| 5,616,921 | 4/1997 | Talbot et al. ........................ 250/492.21 |
| 5,675,499 | 10/1997 | Lee et al. . |
| 5,952,658 | 9/1999 | Shimase et al. ......................... 250/309 |

*Primary Examiner*—Jack Berman
*Attorney, Agent, or Firm*—Bruce D. Riter

[57] ABSTRACT

A method of processing a semiconductor device comprises: applying a focused ion beam to a structure of a semiconductor device to be processed; producing a live detector signal by detecting secondary electrons emitted as the focused ion beam is applied to the structure; comparing the live detector signal with a reference trace having a region indicative of an expected material boundary and a stop marker within said region; and terminating or altering a FIB operation when the live detector signal exhibits a characteristic corresponding to said region of the reference trace. The reference trace can be generated in accordance with the invention by applying a focused ion beam to a reference structure of a semiconductor device; producing a reference detector signal by detecting secondary electrons emitted as the focused ion beam is applied to the reference structure; and preparing from the reference signal a reference trace defining said region indicative of said expected material boundary and said stop marker within the region. The reference trace and the live detector signal are preferably normalized by compensating their average contrast levels, e.g., by applying automatic gain control. Normalized reference end-point traces are divided into distinct slope regions based upon the slope transitions of the trace. One of the slope regions as a "stop region" on a reference end-point trace and a stop marker is assigned to the stop region. A FIB milling process can be automatically terminated or altered, such as by switching enhanced-etch gases, based upon run-time comparison of a live detector signal (live trace) against a reference end-point trace template for which slope regions and stop marker have been assigned. An end-point reference trace prepared while performing a FIB process on a semiconductor device structure can be used as a reference for automatic control of subsequent operations on similar semiconductor device structures.

16 Claims, 14 Drawing Sheets

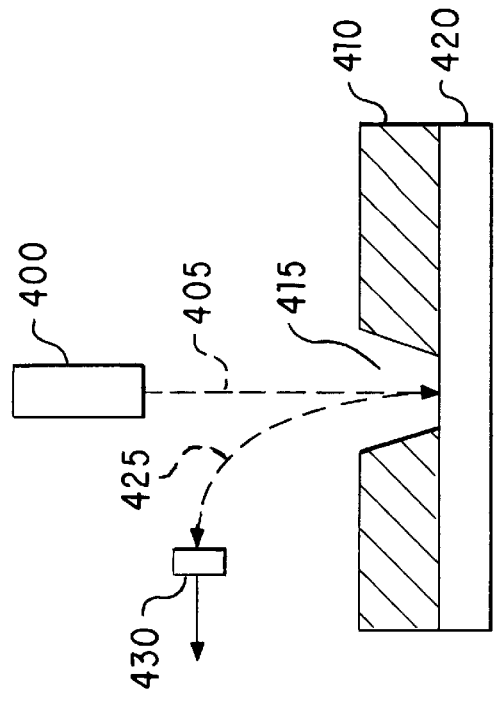
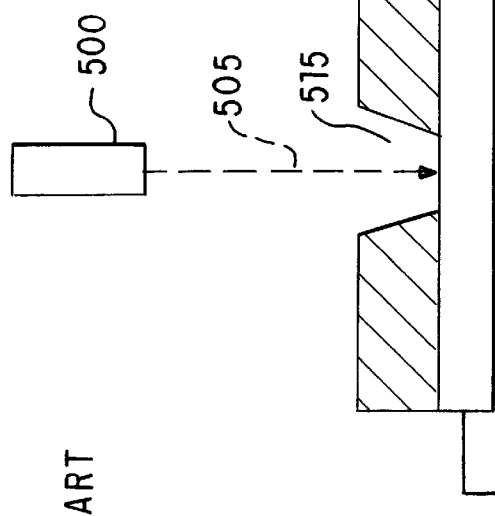
FIG. 3 PRIOR ART
FIG. 4 PRIOR ART
FIG. 5 PRIOR ART

AUTOMATIC SEQUENCING OF FIB OPERATIONS

BACKGROUND OF THE INVENTION

1. Field of the Invention

The present invention relates to the use of a focused ion beam (FIB) system to remove material or deposit material in an automated manner, particularly in modification of a semiconductor device.

2. The Prior Art

A semiconductor device consists of layers of different materials. The top layers of the device structure, up to 5 or more layers, are involved with the interconnections between cells. The interfaces at which these layers meet are referred to as material boundaries; FIG. 1 shows for example a structure 100 having an upper layer 105 and a lower layer 110 which meet at a boundary 115. When a focused-ion beam is used to mill away material from a semiconductor device, it is necessary to determine that the desired material boundary has been reached so that the milling process may be terminated at the desired milling depth. FIG. 2 shows the structure of FIG. 1 in which an opening 200 has been milled in this fashion. Present methods rely on manual intervention to stop the milling process when the material boundary has been reached.

Another reason for the need to detect material boundaries relates to the use of prior-art gas-assisted etching. Gases are injected near the surface of the semiconductor device during the milling process to increase the efficiency of removing a specific type of material. As the boundaries between different materials are traversed, the type of gas injected is changed to conform to the requirements of the new material; that is, a different gas is used for each material or class of materials.

Systems for the treatment of integrated circuits and the like with a focused-ion-beam (FIB) are known. See, for example, U.S. Pat. No. 5,140,164, the content of which is incorporated herein by this reference. A FIB system commercially available as the "IDS P2X FIBstation" from Schlumberger Technologies, Inc., San Jose, Calif., has a gas manifold and capability for changing from one type of injection gas to another Material boundaries between different semiconductor layers may be detected during the ion milling process using a variety of known methods. One such method is to characterize the milling process and then to estimate the time to reach the desired end point. The process is characterized by manually controlling the milling of representative samples of a device, noting parameters such as beam current, gases used, and milling time needed to pass through each layer. The process is then repeated on a similar structure using the same parameters, relying on milling time to reach a desired layer of the structure. If the concentration of ions in a given area and the etch rate properties of the material being milled are known, the time needed to mill through a layer of known material and thickness to reach a layer below it can be mathematically predicted. FIG. 3 shows, for example, a source 300 producing a FIB 305 to mill through a layer 310 in a region 315 to expose a layer 320. The process of milling material of layer 310 can be characterized, so that the time t to mill through a layer of such material of a given thickness can be predicted.

Another method of detecting material boundary change during milling is to visually monitor changes in the secondary-electron count and manually terminate the operation when a change is observed. See U.S. Pat. No. 5,140,164 entitled "IC modification with focused ion beam system." As the primary ion beam strikes the surface of a device, low-energy secondary ions and electrons are emitted. Each material has a different yield of secondary-electron emission: therefore, transitions between layers are indicated by a change in secondary-electron yield. The secondary electrons are detected and used to produce a FIB image of the area being milled. Changes in the number of secondary electrons are manifested in the image as changes in the brightness or contrast. By monitoring contrast changes in the FIB image, material transitions may sometimes be detected. For example, FIG. 4 shows a source 400 emitting a FIB 405 to mill layer 410 in a region 415 to expose a layer 420, while secondary electrons 425 are detected by a detector 430. Detector 430 produces a signal which is used to generate the FIB image.

Another method of detecting material boundaries is to visually monitor for changes in the secondary-ion count and manually terminate the milling operation when a change is observed. This method of end-point detection uses an electron-beam shower to neutralize charging of the device, and a detector which is electrically biased so as to detect positively-charged secondary ions. Material transitions are detected by plotting the detected secondary-ion intensity versus the ion dosage per unit area (nanocoulombs per square micron). The resulting traces can be interpreted so as to determine where material transitions occur.

Yet another method of detecting material boundaries is to monitor changes in atomic composition, using known detection techniques such as SIMS, Auger or EDX These allow the composition of the material being milled to be determined by analyzing the waste material removed during the milling process. Material transitions are detected by determining when the composition of the material being milled changes.

A further method of detecting material boundaries is to monitor current passing through the stage on which the device is held during milling. A semiconductor device is electrically grounded to an X-Y stage of the FIB system during milling. As the primary ion beam strikes the surface of the device, electrical charge builds up on non-conductive surfaces. When a conductive material is reached, a path to ground becomes available for this built-up charge. This produces a current from the stage to ground. By monitoring and measuring this current while milling a non-conductive layer, it can sometimes be determined when a conductive material has been reached. FIG. 5 shows a source 500 supplying a FIB 505 which mills through a non-conductive layer 510 in a region 515 to expose a conductive layer 520. When conductive layer 520 is exposed, charge which built up on layer 510 during milling is discharged to ground as a current 525 which indicates the conductive layer has been reached.

It is also known to detect material boundaries by providing within the semiconductor structure a marker layer which has optical properties different from the etched or protected layers so as to be optically detectable when exposed by milling. See U.S. Pat. No. 5,395,769 "Method for controlling silicon etch depth." The method depends upon designing the additional layer into the semiconductor structure and is not relevant to FIB milling of devices which do not have such a marker layer.

SUMMARY OF THE INVENTION

A desired goal is to fully automate the operation of an FIB milling system for operations such as probe-point creation (milling an opening through one or more layers to expose a buried layer, as in FIG. 2) or device microsurgery (removing and depositing material to modify a device). To automate the operation, it is necessary to acquire information which may be used by the controlling software to determine that a material transition has been reached, without requiring user intervention.

In accordance with embodiments of the invention, a method of processing a semiconductor device comprises: applying a focused ion beam to a structure of a semiconductor device to be processed; producing a live detector signal by detecting secondary electrons emitted as the focused ion beam is applied to the structure; comparing the live detector signal with a reference trace having a region indicative of an expected material boundary and a stop marker within said region; and terminating or altering a FIB operation on the structure of the semiconductor device when the live detector signal exhibits a characteristic corresponding to said region of the reference trace. The reference trace can be generated in accordance with the invention by applying a focused ion beam to a reference structure of a semiconductor device; producing a reference detector signal by detecting secondary electrons emitted as the focused ion beam is applied to the reference structure; and preparing from the reference signal a reference trace defining said region indicative of said expected material boundary and said stop marker within the region.

The reference trace and the live detector signal are preferably normalized by compensating their average contrast levels, e.g., by applying automatic gain control. Normalized reference end-point traces are divided into distinct slope regions based upon the slope transitions of the trace. One of the slope regions as a "stop region" on a reference end-point trace and a stop marker is assigned to the stop region. The FIB milling process can be automatically terminated or altered, such as by switching enhanced-etch gases, based upon run-time comparison of a live detector signal (live trace) against a reference end-point trace template for which slope regions and stop marker have been assigned. An end-point reference trace prepared while performing a FIB process on a semiconductor device structure can be used as a reference for automatic control of subsequent operations on similar semiconductor device structures.

These and other features of the invention will become apparent to those of skill in the art from the following description and the accompanying drawing figures.

BRIEF DESCRIPTION OF THE DRAWING

FIG. 3 shows a source producing a FIB to mill through a layer of material to expose an underlying layer of material by estimating the time to the desired milling end-point in prior-art manner;

FIG. 4 shows a source emitting a FIB to mill a layer of material to expose a layer of underlying material while monitoring changes in the secondary electron count to determine a milling end-point in prior-art manner;

FIG. 5 shows a source supplying a FIB to mill a through a non-conductive layer to expose a conductive layer while monitoring stage current to determine a milling end-point in prior-art manner;

DETAILED DESCRIPTION

Methods of the present invention can be carried out using a Schlumberger FIBstation or other suitable FIB system. Examples of such a system are described in U.S. Pat. No. 5,140,164 to Talbot et al. and U.S. Pat. No. 5,675,499 to Lee et al., which are incorporated herein by this reference.

Detection of material boundaries during FIB milling

Prior art methods of generating end-point traces involve visually monitoring the contrast level in the image of the area being milled. As material boundaries are reached during the milling process, the contrast level in the currently displayed FIB image will change, becoming either brighter or darker. The contrast range typically consists of grey levels between 0 (black) and 255 (white).

Figure 1:
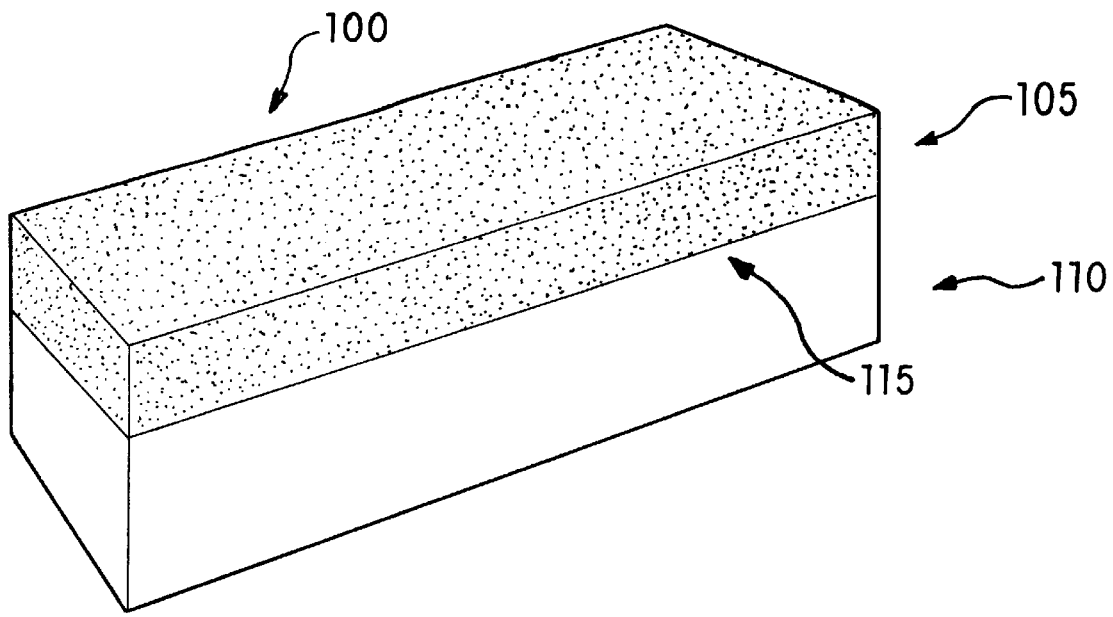
FIG. 1 illustrates a prior-art structure having an upper layer and a lower layer which meet at a material boundary.
Figure 2:
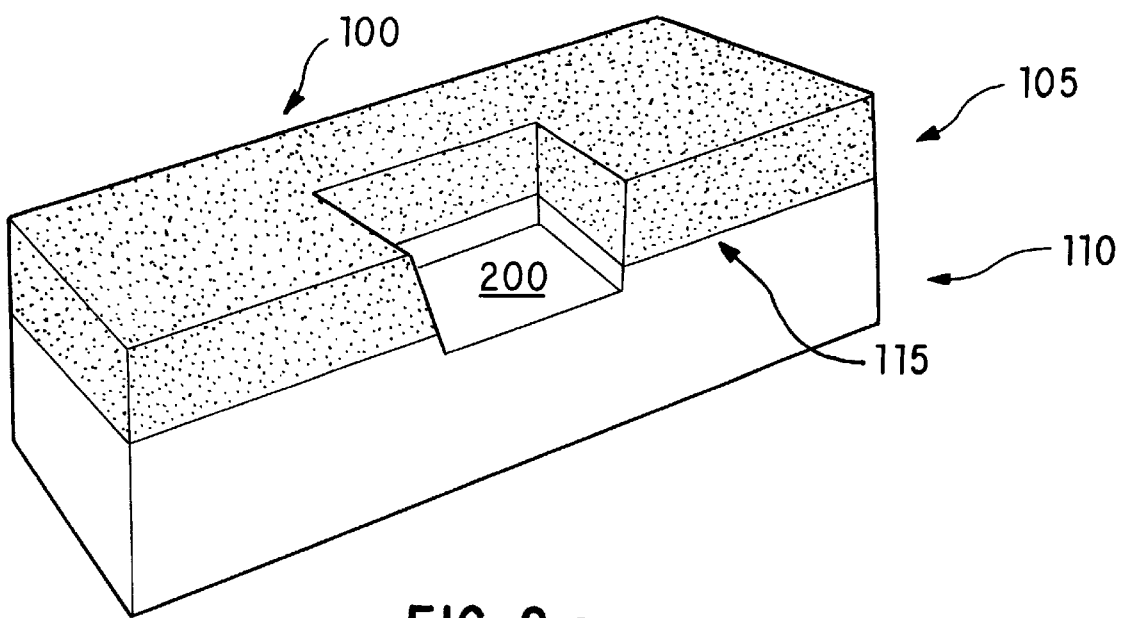
FIG. 2 shows the structure of FIG. 1 in which FIB milling of an opening has been stopped after passing through a material boundary in prior-art manner.
Figure 6A:
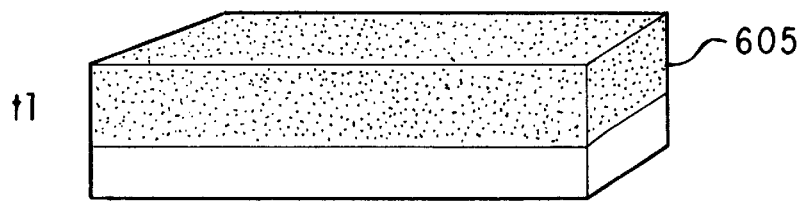
FIGS. 6A, 6B and 6C show a layered structure at respective times t1, t2 and t3 during FIB milling of an opening in the structure.
Figure 6B:
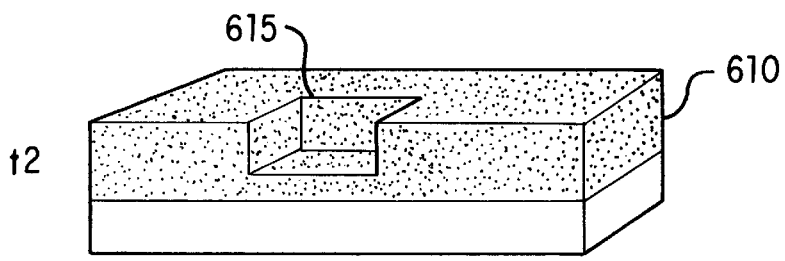
Figure 6C:
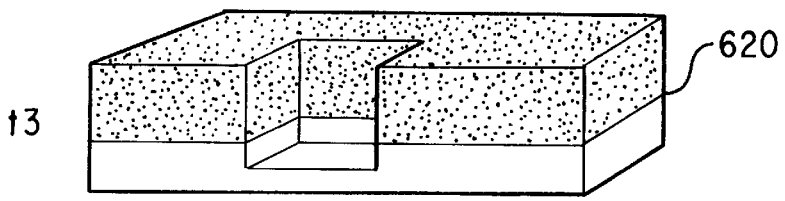
Figure 7:
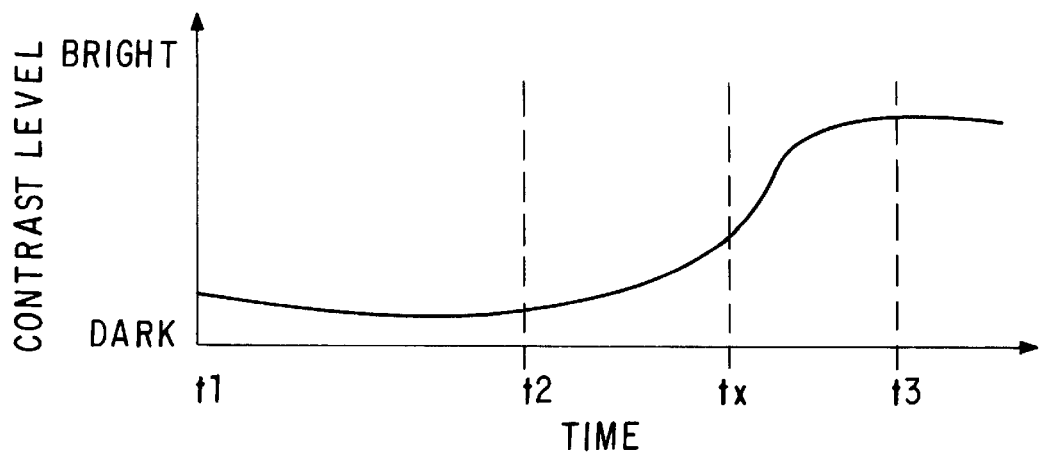
FIG. 7 shows a plot of contrast level vs. time during the FIB milling sequence of FIGS. 6A–6C.

In accordance with one aspect of the invention, this contrast change is plotted as a function of contrast level versus milling time to produce an "end-point trace." By examining the shape of the contrast level traces that are produced from this process, the transition points between material boundaries may be detected. Consider the example of FIGS. 6A–6C and 7. FIG. 6A shows the condition of a structure 600 having layers 605 and 610 at a time t1 when milling begins. FIG. 7 is an end-point trace (a plot of contrast vs. milling time) showing a dark contrast level at time t1. FIG. 6B shows the condition of structure 600 at time t2 when milling has proceeded partially through layer 605 in region 615. FIG. 7 shows the contrast level to remain dark at time t2. FIG. 6C shows the condition of structure 600 at time t3 after milling through the interface 620 between layers 605 and 610. The contrast level of FIG. 7 at time t3 is bright in comparison to times t1 and t2, having transitioned from dark to bright in the vicinity of time tx as milling passed through interface 620.

It is noted that prior-art milling methods have not generated reference end-point traces to use as a guide in manually determining when a material boundary has been reached; instead, a contrast image is visually monitored in such methods to detect a contrast-level change that would indicate that a material boundary has been reached. If the contrast level is not regulated, it can reach values which prevent visual identification of features of the area being milled. For example, when milling through oxide, the transition to metal can produce a contrast change which produces a very bright image. To continue visually monitoring progress of the milling operation in the prior-art methods, it becomes necessary to manually readjust the contrast to a more reasonable level.

Figure 8A:
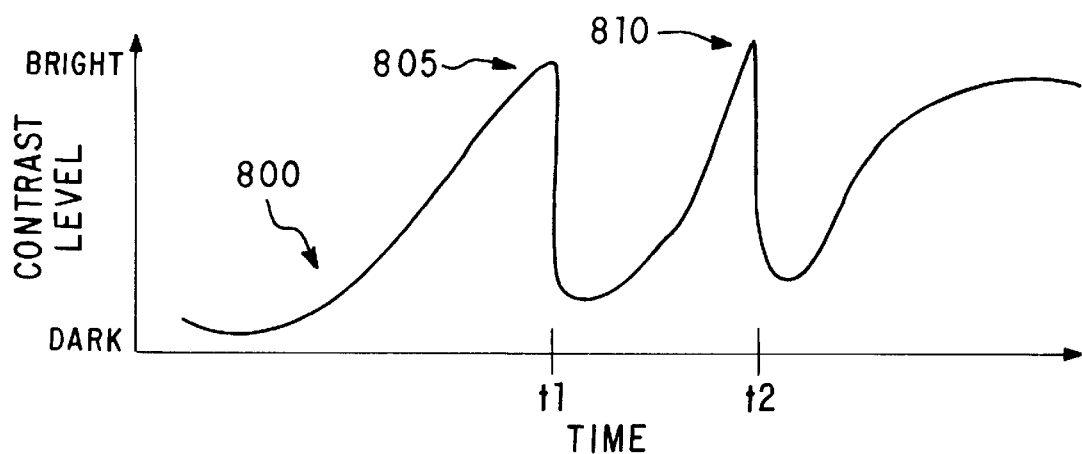
FIG. 8A is an example of an unregulated end-point trace prior to normalization.

The inventors have found that such contrast-level readjustment in the prior-art methods produces noticeable deflections in the end-point trace of contrast level vs. time, thus rendering the trace unusable as a reference for later repairs on similar material structures. An example is shown in FIG. 8A. End-point trace 800 begins at a dark contrast level as an oxide layer is milled, rising to a bright level at 805 as a portion of the underlying metal layer is exposed. The contrast level is readjusted at time t1 so that milling of the metal layer can be visually monitored. When milling passes through the metal layer into an underlying non-metal layer, the contrast level declines abruptly at 810. As the contrast level becomes quite dark, another readjustment is required at time t2 to keep the contrast level within a range which permits visual monitoring of the milling process.

Using auto contrast to generate reference end-point traces

Figure 8B:
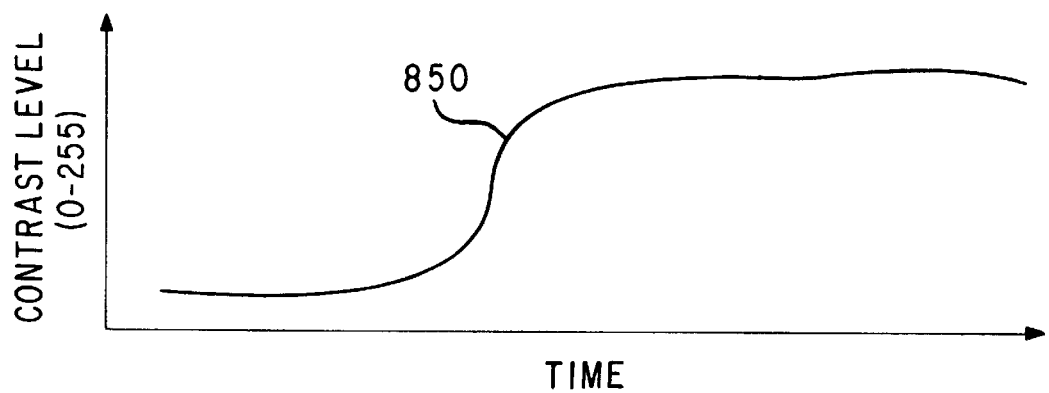
FIG. 8B is an example of a normalized end-point trace.

In accordance with an aspect of the invention, the contrast level is automatically maintained so that end-point traces can be used as reference traces. A valid, usable reference end-point trace is acquired by holding the contrast level constant and plotting the changes that are applied to the contrast (e.g., in the contrast register of a Schlumberger FIBStation system) in order to maintain the current average contrast level. This can be done in accordance with the invention by use of an auto-contrast maintenance capability in which the user sets the initial desired contrast level (e.g., in the FIB image display tool of a Schlumberger FIBStation system). The average contrast level in the FIB image window is continuously monitored during the milling operation. As changes in the average contrast level are detected, they are automatically compensated by applying the appropriate adjustment to the contrast register. (Compensation of the contrast level can be performed manually in the operation of a prior-art FIBstation system, albeit with intermittent rather than continuous updates.) FIG. 8B illustrates the kind of normalized end-point trace 850 which might be produced in accordance with the invention by maintaining the contrast level within a 0 to 255 grey-level range as the FIB mills a layered semiconductor structure.

Figure 9A:
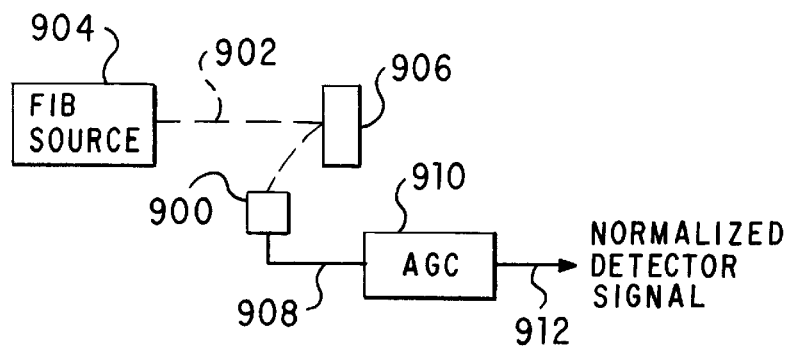
FIG. 9A schematically illustrates the concept of compensating average contrast level in accordance with the invention.

Compensation of the average contrast level is automated in accordance with the invention. FIG. 9A schematically illustrates the concept schematically. A detector 900 detects secondary particles as a FIB 902 from source 904 mills a DUT 906. Detector 900 supplies a live detector signal at 908 to automatic-gain-control 910 which in turn supplies a normalized detector signal 912. In practice, it is convenient in a FIB system having digital signal processing, such as a Schlumberger FIBstation system, to perform the automatic gain control function by monitoring and applying changes to the contrast register as needed to compensate changes in the average contrast level. The changes that are applied to the contrast register are displayed as an end-point trace. Since all contrast adjustments are limited to maintain the contrast level within a 0 to 255 grey-level range, the end-point traces that are produced are thereby normalized. The contrast register and normalized end-point trace data store can be any suitable portions of memory within the system.

Figure 9B:
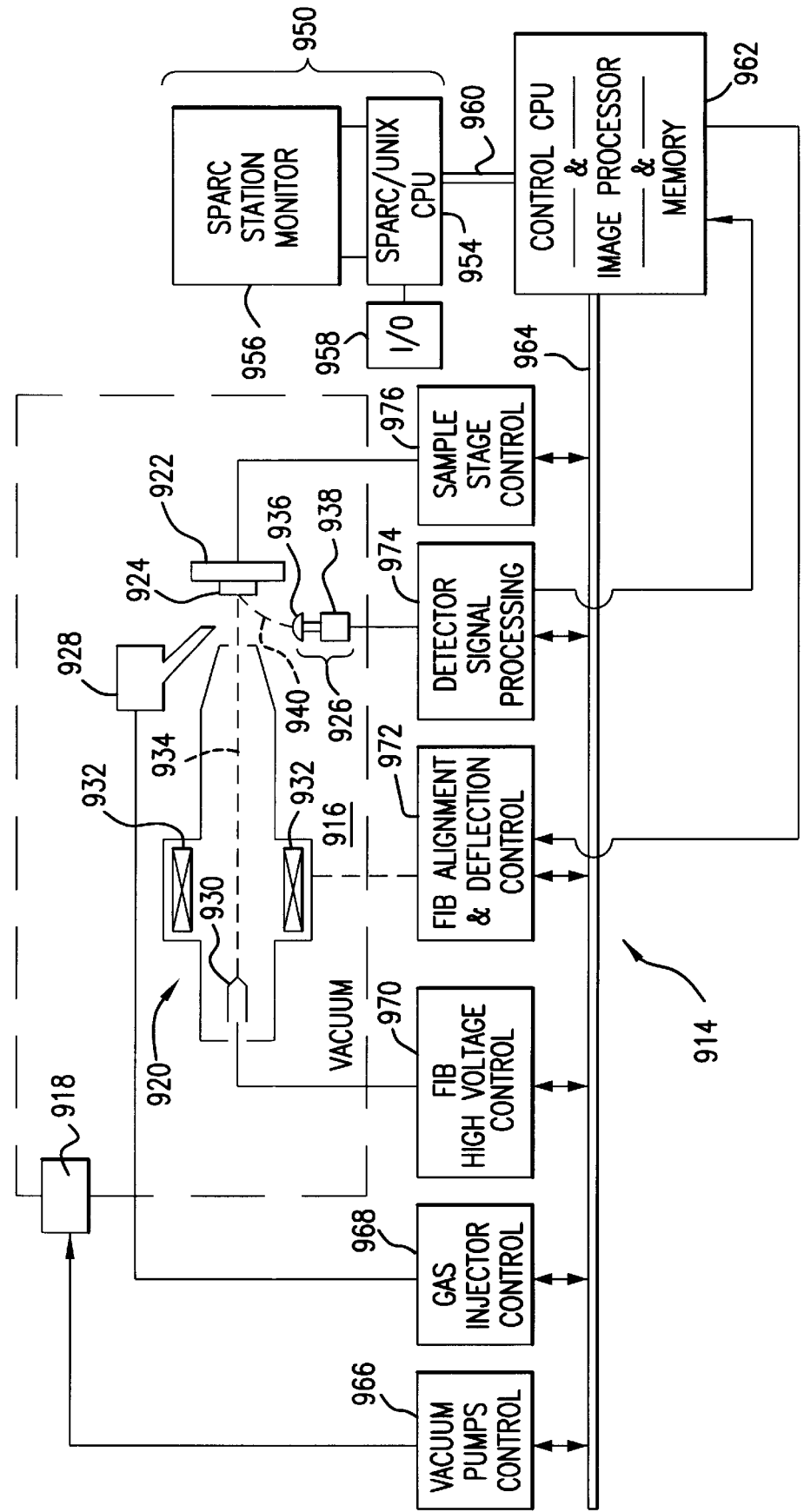
FIG. 9B shows a schematic diagram of a FIB system 914, including processors and memory, which can be used in carrying out the invention.

FIG. 9B shows a schematic diagram of a FIB system, including processors and memory, which can be used in carrying out the methods of the present invention. A vacuum chamber 916 evacuated by pumps 918 encloses a FIB column 920, a specimen stage 922 for holding a DUT 924, a detector 926 and a gas injector 928. Column 920 includes an ion source 930, and ion-optical elements 932 for controlling alignment and deflection of ion beam 934. Detector 926 may comprise a scintillator 936 and a photo-multiplier tube 938 for detecting secondary particles 940 emitted when FIB 934 impinges on specimen 924. The system includes a workstation 950 having a processor unit (CPU) 954, a monitor 956 and input/output (I/O) devices 958 such as a keyboard and/or mouse. Workstation 950 is linked by a bus 960 to a system control unit 962 comprising a control CPU, an image processor, and memory registers. System control unit 962 communicates via a bus 964 with a vacuum-pumps control 966 for controlling vacuum pumps 918, with gas injector control 968 for controlling gas injector 928, with FIB high-voltage control 970 for controlling ion source 930, with FIB alignment & deflection control 972 for controlling ion optical elements 932, with detector-signal processing electronics 974 which receive a detector signal from detector 926, and with specimen-stage control 976 for controlling specimen stage 922 to position specimen 924. System control unit 962 supplies beam control information to FIB alignment and deflection control 972. In operation, a DUT 924 is placed in vacuum chamber 916. Chamber 916 is evacuated. Under control of system control unit 962, FIB 934 is scanned over a selected region of the DUT for milling. During milling, a suitable gas is injected at the surface of specimen 924 from gas injector 928 as commanded by the system control unit.

The process of generating a reference end-point trace using auto-contrast maintenance is referred to herein as "normalization" of the end-point trace. A reference end-point trace generated by this process can be used as a recipe for executing similar milling operations. That is, end-point traces are normalized to provide reference traces useful for repetitively performing the same operation. The reference traces can be used, for example, as a template for determining the stop time for a milling operation on structures composed of similar material layers, because the reference traces are consistent with one another when generated from similar material structures. Because of this, they may be used as reference traces. Repeatability of reference trace generation with auto-contrast maintenance allows automatic determination in accordance with the invention of when the milling process should be stopped, without requiring manual intervention.

Matching reference end-point traces with live end-point traces

Figure 10:
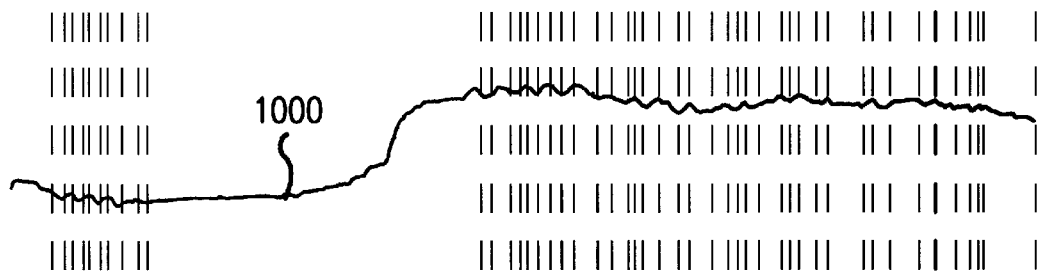
FIG. 10 is an example of a reference trace divided into slope regions using high sensitivity to slope changes.
Figure 11:
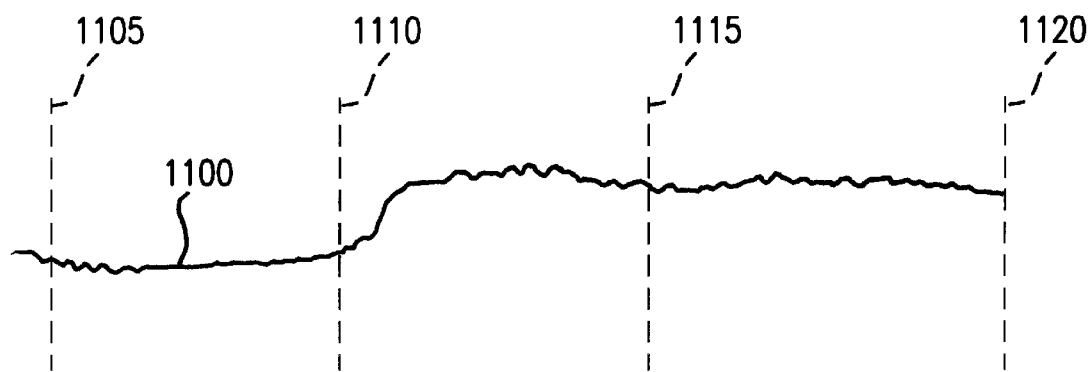
FIG. 11 is an example of a reference trace divided into slope regions using low sensitivity to slope changes.

In another aspect, the present invention enables automated comparison of a reference end-point trace with a live end-point trace. As a live milling operation proceeds, the live end-point trace is compared against a selected reference trace. This is done by dividing the reference trace into distinct regions. The regions are determined by estimating the slope of the reference trace over a segment of selected width, such as over several screen pixels. (The trace is obtained in a FIBStation by acquiring contrast level values at discrete times, and is displayed by converting these samples to screen pixels having an x,y display position and a contrast-level value. The slope over several screen pixels can be determined by calculating the rate of change of contrast-level value over a selected number of screen pixels.) Distinct changes in slope are used to define region boundaries. The number of distinct regions that are generated may be varied by adjusting a sensitivity setting. Setting the sensitivity to a high level divides the trace into more regions. An example is shown in FIG. 10. With sensitivity set to a high level, reference trace 1000 is divided into many regions, indicated in FIG. 10 by vertical dashed lines at the region boundaries. Setting the sensitivity to a low level divides the trace into fewer regions. An example is shown in FIG. 11. With sensitivity set to a low level, reference trace 1100 is divided into a small number of regions corresponding to major changes in the reference traces. The regions are indicated in FIG. 11 by vertical dashed lines 1105, 1110, 1115 and 1120 at the region boundaries. As a live end-point trace is generated during milling, region changes are monitored and compared against the corresponding reference trace region.

Error detection while matching reference regions against live regions

In accordance with another aspect of the invention, the live end-point trace produced during a milling operation is continuously (or frequently) compared with a reference trace as the milling proceeds. For this purpose, slope regions of the live end-point trace are compared with slope regions of the reference trace to determine whether the slope regions match between the two traces. If a difference in slope is detected between the two regions, an error message can be generated and the milling process automatically terminated.

Stopping the milling process automatically based upon reference end-point trace

Figure 12:
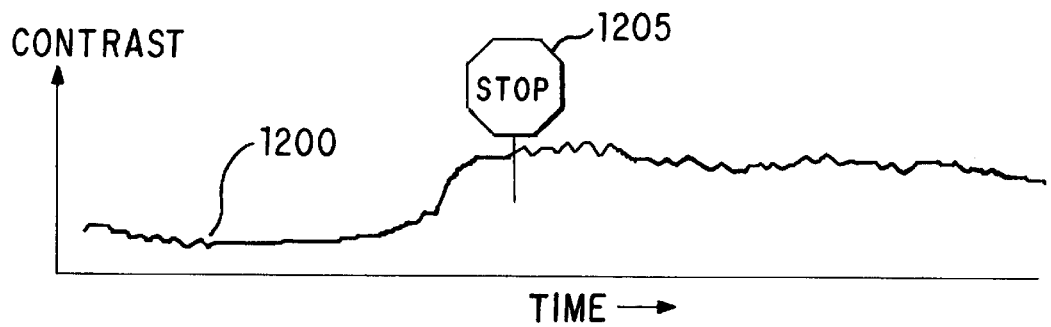
FIG. 12 illustrates the placement of a stop marker on a reference trace relative to a contrast change.
Figure 13:
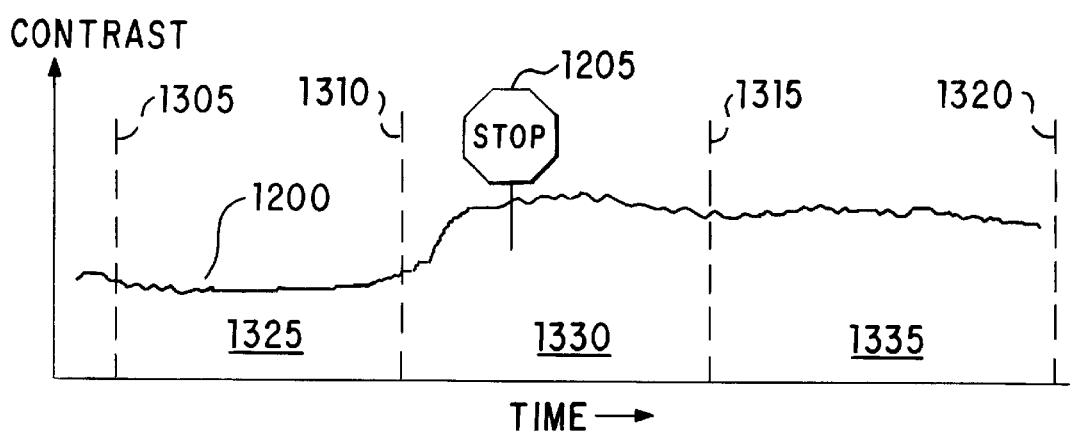
FIG. 13 shows the relationship of the stop marker of FIG. 12 to slope region boundaries of the reference trace.

In yet another aspect, the invention provides a method for setting a milling stop point based upon a reference trace. An example is shown in FIG. 12, in which a stop marker 1205 has been placed on a reference trace 1200 at the desired stop location. FIG. 13 shows the same trace and stop marker along with region boundaries 1305, 1310, 1315 and 1320 defining regions 1325, 1330 and 1335. The region in which the stop marker is placed, region 1330, is designated as the "stop region."

Figure 14:
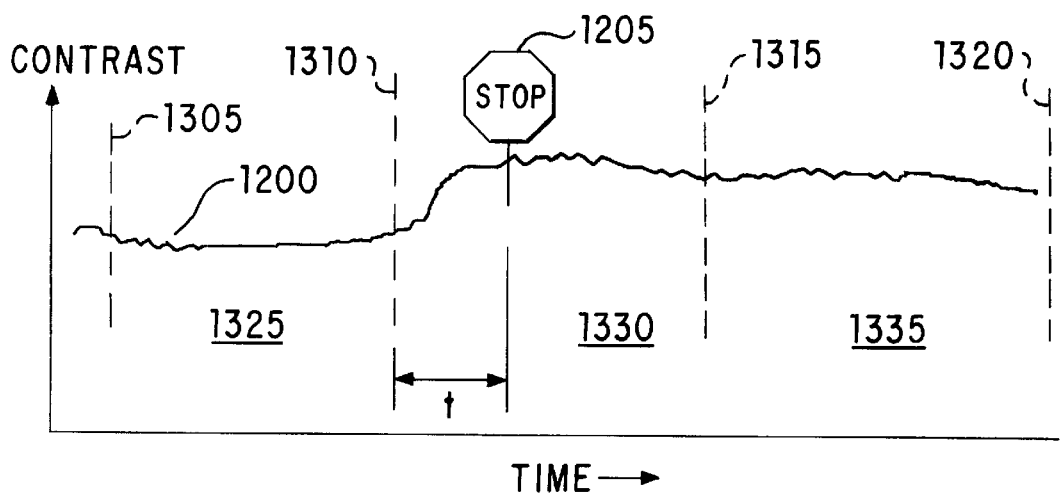
FIG. 14 shows the time relationship of the stop marker of FIG. 12 relative to a slope region boundary of the reference trace.

As milling proceeds, the live-trace slope regions are compared against the reference-trace slope regions. When it is detected that the live end-point trace has passed into the "stop region," a timer begins counting the time between the stop region boundary on the reference trace and the location of the stop marker. FIG. 14 shows the time t from region boundary 1310 until stop marker 1205 which is to be counted as milling progresses beyond regio n boundary 1310.

The time can also be scaled using the ratio of the ion dose density used in creating the reference trace ($idd_{ref}$) to the ion dose density used in acquiring the live trace ($idd_{live}$), i.e., with a time-scaling factor equal to $idd_{ref}/idd_{live}$. That is, since the milling time is proportional to the ion dose density, differences between the ion dose density used in the milling operation from which the reference trace was created and the ion dose density used in the milling operation from which the live trace is obtained can be readily compensated using the ratios of the ion dose densities (i.e., $t_{live}=t_{ref}(idd_{ref}/idd_{live})$. The milling process can be automatically terminated when the appropriate time has elapsed.

Figure 15:
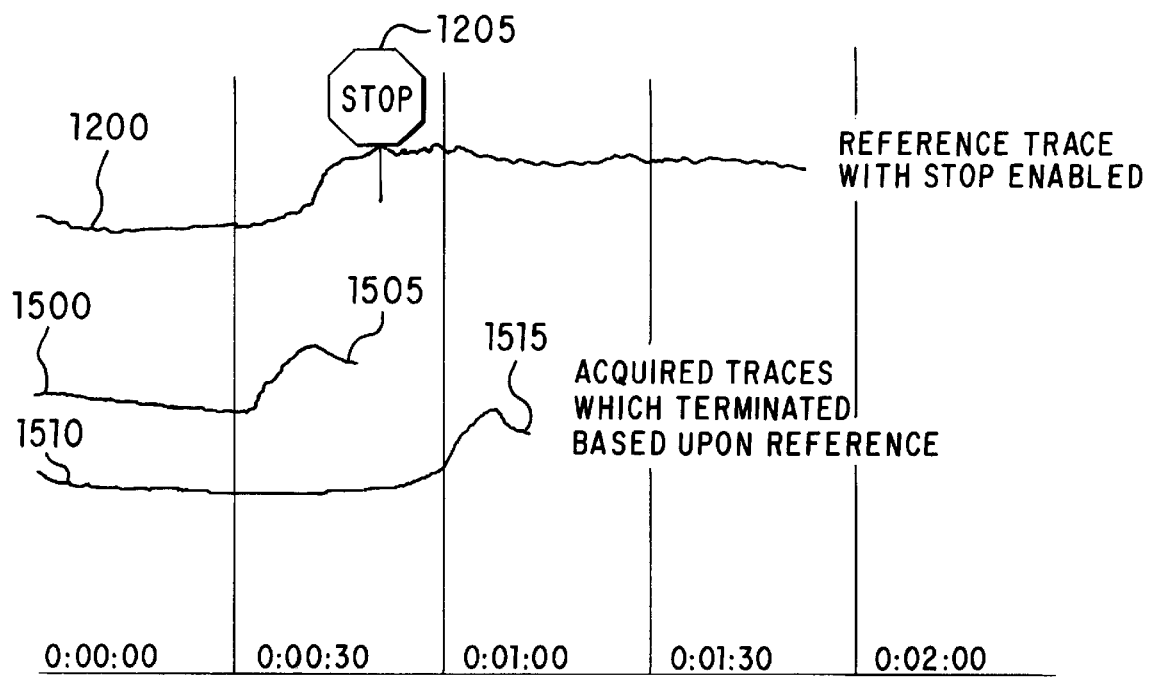
FIG. 15 shows examples in which milling is terminated based upon comparison of live end-point traces with a reference trace in accordance with the invention.

If the regions of the live trace and the reference trace do not match at any time during milling, the process can be automatically terminated. The comparison of slope regions makes the comparison of end-point traces to reference traces independent of variations in scale and offset. Examples are shown in FIG. 15. Comparing live trace 1500 with reference trace 1200 results in automatic termination of milling at 1505 when the slope of trace 1500 corresponds with the slope in region 1330 of reference trace 1200. Similarly, comparing live trace 1510 with reference trace 1200 results in automatic termination of milling at 1515 when the slope of trace 1510 corresponds with the slope in region 1330 of reference trace 1200. Note that the absolute time to endpoint differs in each case, but that use of trace slopes makes it possible to compare the traces.

Switching enhanced etch gases based upon reference endpoint trace

Figure 16A:
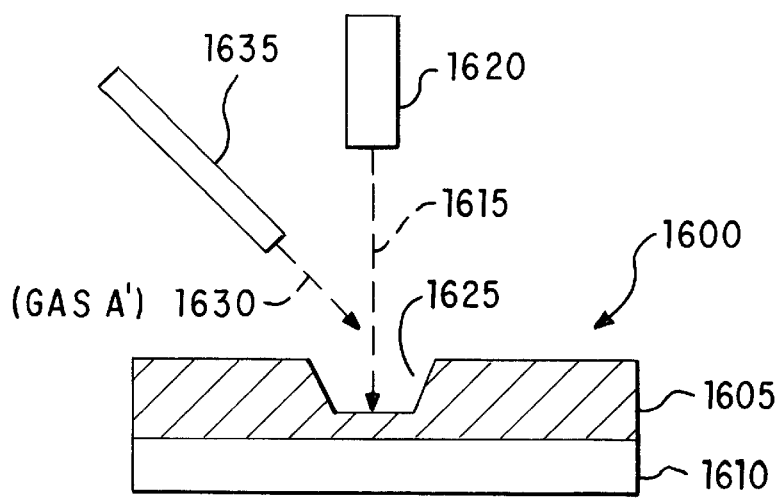
FIGS. 16A and 16B illustrate the automated optimization of gas-enhanced FIB milling in accordance with the invention.
Figure 16B:
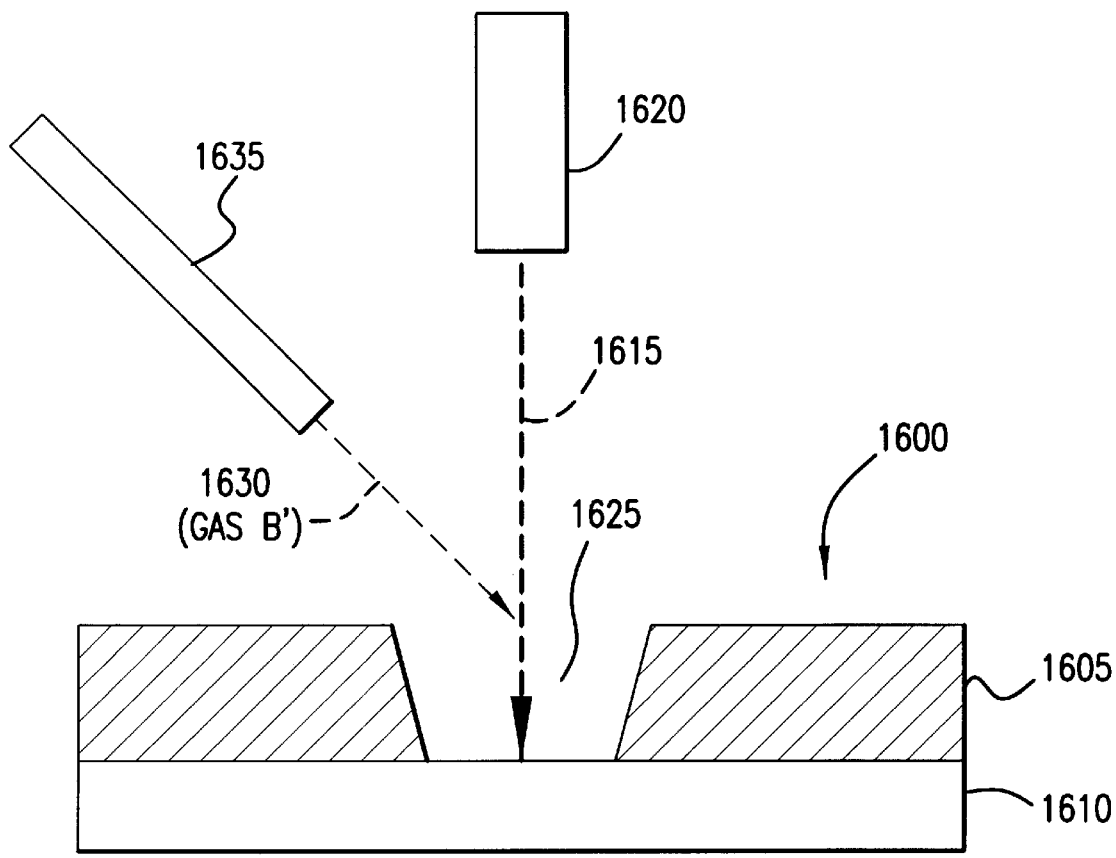

The ability to terminate a milling operation based upon comparison of a live trace against a reference trace also allows the system to automatically switch between selected etch gases when one end point is reached and continue milling with a different etch gas until a second end point is reached. The milling operation can then proceed using the new gas so that it optimizes the etch rate to the material being milled at each stage of the operation. For example, FIG. 16A shows a semiconductor device 1600 having a first layer 1605 of material A and a second layer 1610 of material B. FIB 1615 from source 1620 is used to etch an opening 1625 while a stream 1630 of gas A' is supplied from a source 1635 to optimize the etching of material A. When etching through later 1605 is complete and layer 1610 is exposed, as shown in FIG. 16B, a different gas B' is used to optimize the etching of material B. In order to automate the process of switching between gas A' and gas B', it is necessary to automatically determine the point at which the transition between material A and material B is reached. Methods in accordance with the present invention make it possible to determine the transition point by comparison of a live trace with a reference trace, as described herein, so that the type of gas being supplied can be changed when the transition is identified.

Figure 17A:
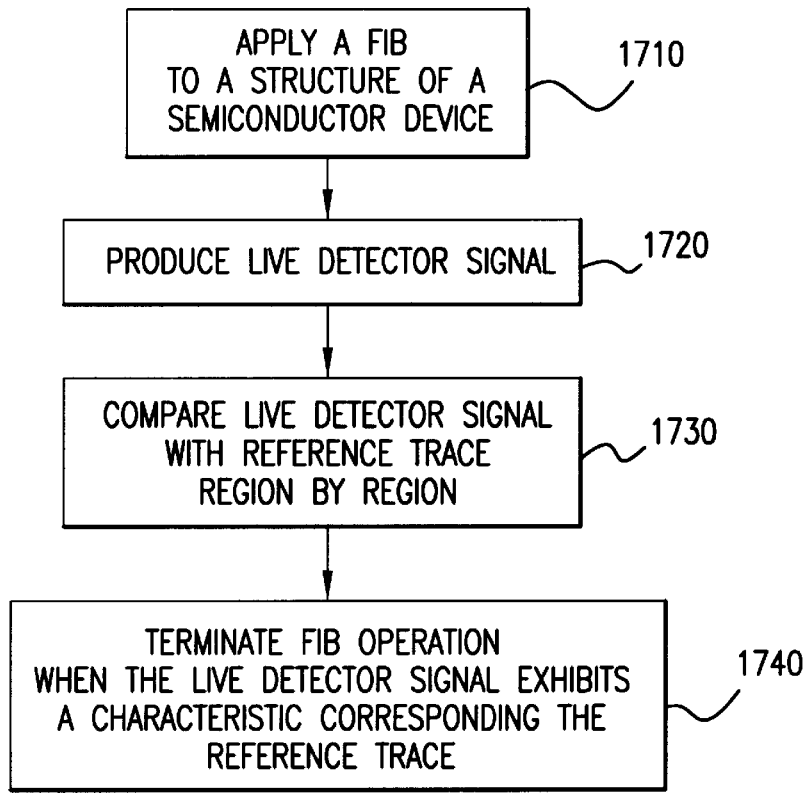
FIG. 17A is a high-level flow chart of an automated end-point analysis algorithm in accordance with the invention.
Figure 17B:
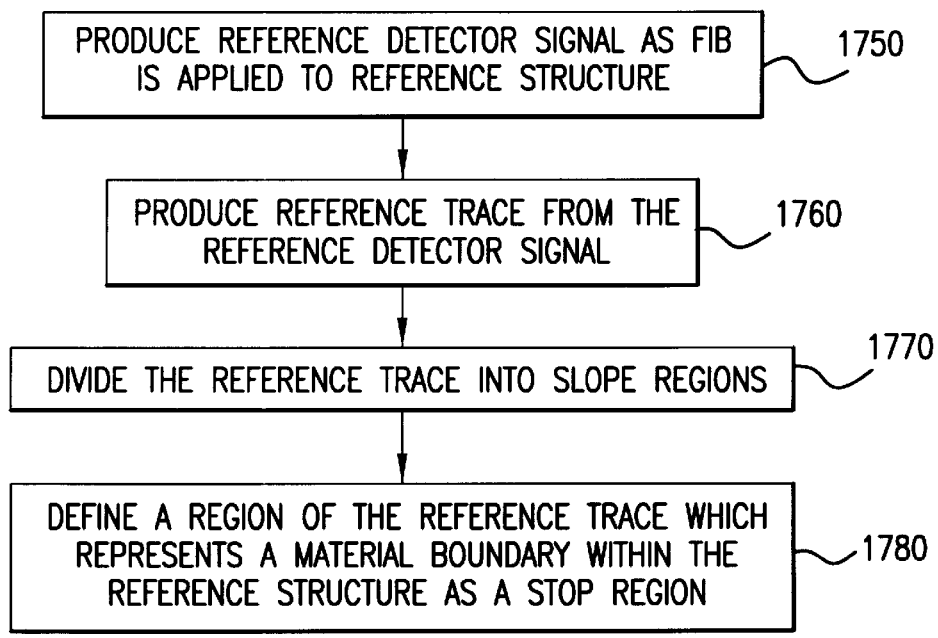
FIG. 17B is a high-level flow chart showing the preparation of a reference trace in accordance with the invention.

FIG. 17A is a high-level flow chart of an automated end-point analysis algorithm in accordance with the invention, useful in processing a semiconductor device. In step 1710, a FIB is applied to a structure of a semiconductor device to be processed. In step 1720, a live detector signal is produced by detecting secondary electrons emitted as the focused ion beam is applied to the structure. In step 1730, the live detector signal is compared with a reference trace having a region indicative of an expected material boundary and a stop marker within said region. In step 1740 the FIB operation is terminated when the live detector signal exhibits a characteristic corresponding to said region of the reference trace. The termination can involve terminating application of the FIB to the structure, or changing parameters of the FIB operation such as by switching from application of a first gas to a second gas as FIB milling continues. FIG. 17B is a high-level flow chart showing the preparation of a reference trace in accordance with the invention. In step 1750, a reference detector signal is produced by detecting secondary electrons emitted as the focused ion beam is applied to the reference structure. In step 1760, a reference trace is produced from the reference signal. In step 1770, the reference trace is divided into slope regions. In step 1780, a slope region of the reference trace which represents a material boundary within the reference structure is defined as a stop region. The reference trace and the live detector signal are preferably normalized by compensating their respective average contrast levels, such as with use of automatic gain control.

Figure 18:
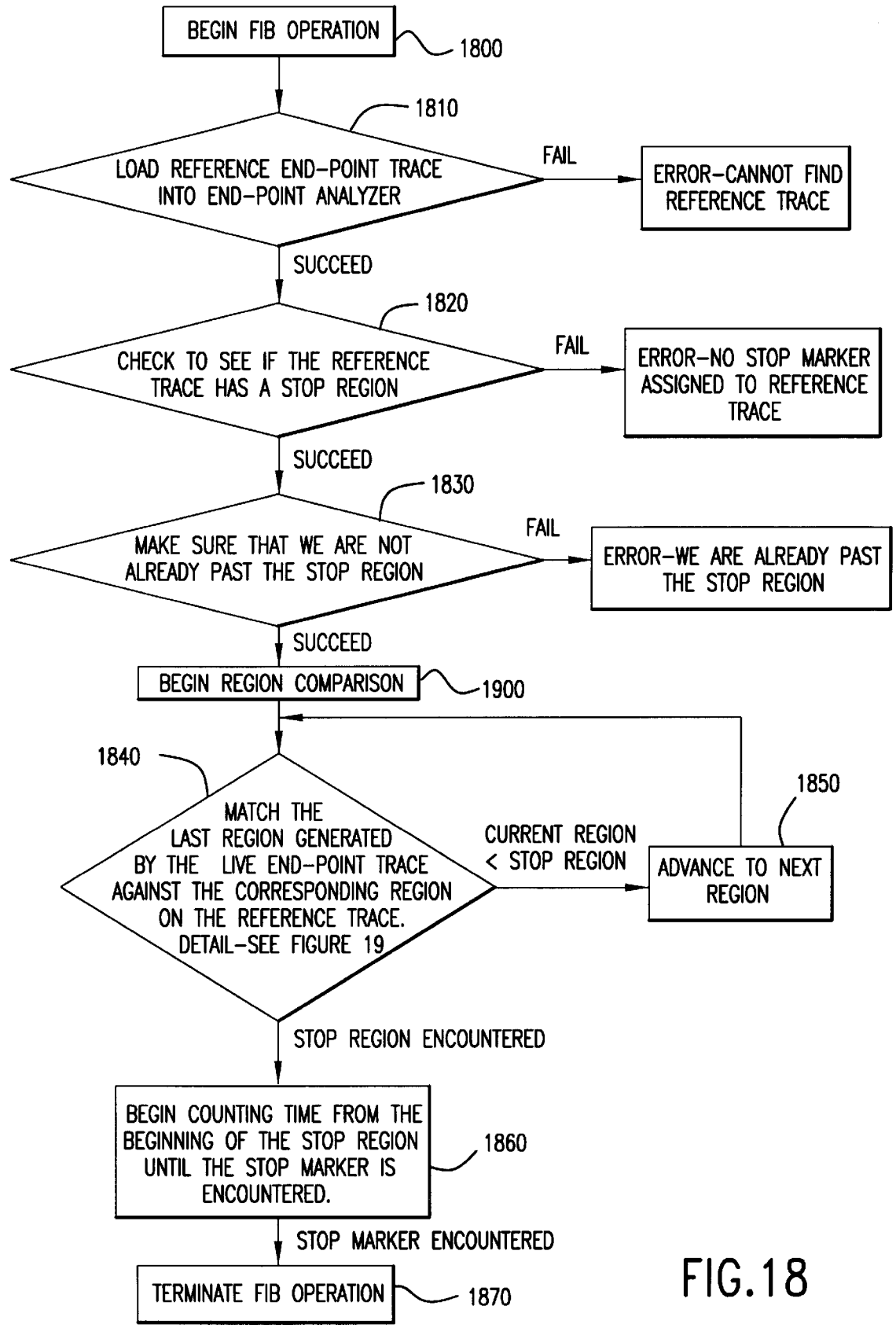
FIG. 18 is a more detailed flow chart of an automated batch-repair end-point analysis algorithm in accordance with the invention.

FIG. 18 is a flow chart of an automated batch-repair end-point analysis algorithm in accordance with the invention. The FIB operation begins at step 1800. A FIB is applied to a structure of a DUT and a live detector signal (live end-point trace) is produced by detecting secondary particles. A previously stored reference trace is loaded at step 1810 to make it available for comparison with a live trace. If loading fails, an error message is generated indicating that a reference trace cannot be found. If loading is successful, a check is made at step 1820 to see if the reference trace has a stop region, such as region 1330 of FIG. 13. If no stop region is found, an error message is generated indicating that no stop marker is assigned to the reference trace. If a stop region is found, a check is made at step 1830 to see if the live process has already passed the stop region. If yes, then an error message is generated indicating that the stop region has been passed. If no, then region comparison of the live end-point trace with the reference trace begins at step 1840.

In step 1840, the last region generated of the live end-point trace is compared with the corresponding region of the reference trace. This comparison operation is described in more detail below with reference to the flowchart of FIG. 19. The comparison advances at step 1850 to the next region and continues in a loop as illustrated as long as the current region is not yet the stop region. When the stop region is encountered, control passes to step 1860 where time is counted from the beginning of the stop region until the stop marker is encountered, such as time t of FIG. 14 from slope-region boundary 1310 until stop marker 1205 is reached. When the stop marker is encountered, the current FIB milling operation is terminated at step 1870. Termination of the FIB milling operation can involve terminating application of the FIB to the structure or, if milling is to continue with application of a different etching gas, terminating application of a first gas and commencing application of a second gas as milling continues.

Figure 19:
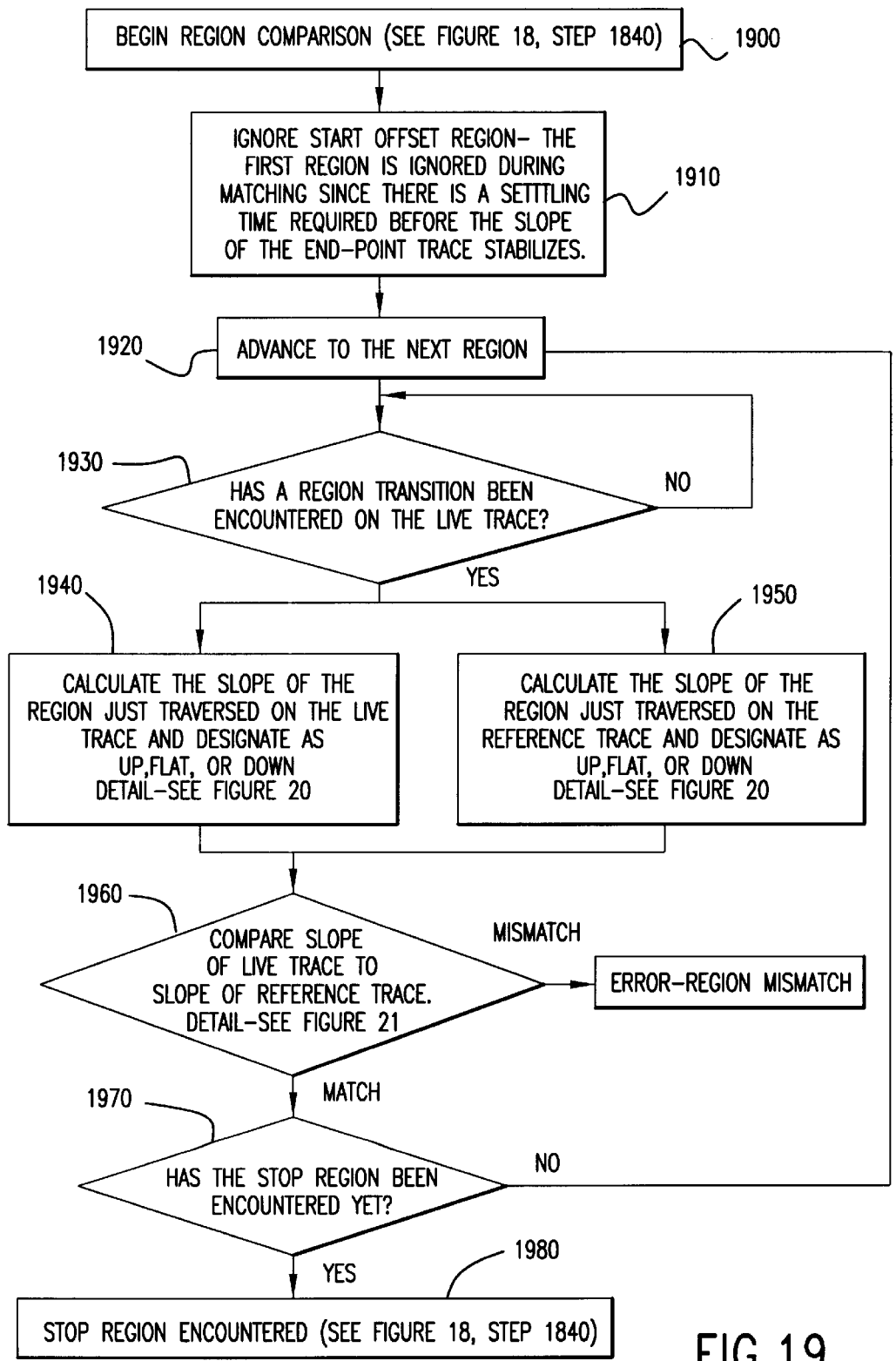
FIG. 19 is a flow chart of a region matching algorithm for the batch repair method of FIG. 18.

FIG. 19 is a flow chart of a region-matching algorithm for the batch repair method referenced at step 1840 of FIG. 18. Region comparison begins at step 1900. In step 1910, matching of the live end-point trace to the reference trace is preferably postponed by ignoring the first slope region due to settling time required for the slope of the live end-point trace to stabilize. In step 1920, comparison advances to the next region. In step 1930, the comparison is monitored to determine whether a region transition has been reached. When a region transition is reached, two calculations are made: in step 1940, the slope of the region just traversed on the live trace is calculated and designated at UP, FLAT, or DOWN; in step 1950, the slope of the region just traversed on the live trace is calculated and designated at UP, FLAT, or DOWN. A method of slope calculation which can be used in steps 1940 and 1950 is described with reference to FIG. 20. As an alternative to simultaneous calculation of the region slopes in steps 1940 and 1950, region slopes for the reference trace can be prepared in advance.

In step 1960, the calculated region slope of the live end-point trace is compared to the region slope of the reference trace. A method of performing slope comparison which can be used in step 1960 is described with reference to FIG. 21. If the slopes do no match, an error message is generated indicating region mismatch and, if desired, the milling operation is automatically terminated so that the reason for mismatch can be manually investigated. If the slopes match, then a check is made at step 1970 to see if the stop region has been encountered. If the slopes do not match, then control returns to step 1920 and for processing of the next region. If the slopes match, then the stop region has been encountered, and control returns to step 1860 of FIG. 18.

Figure 20:
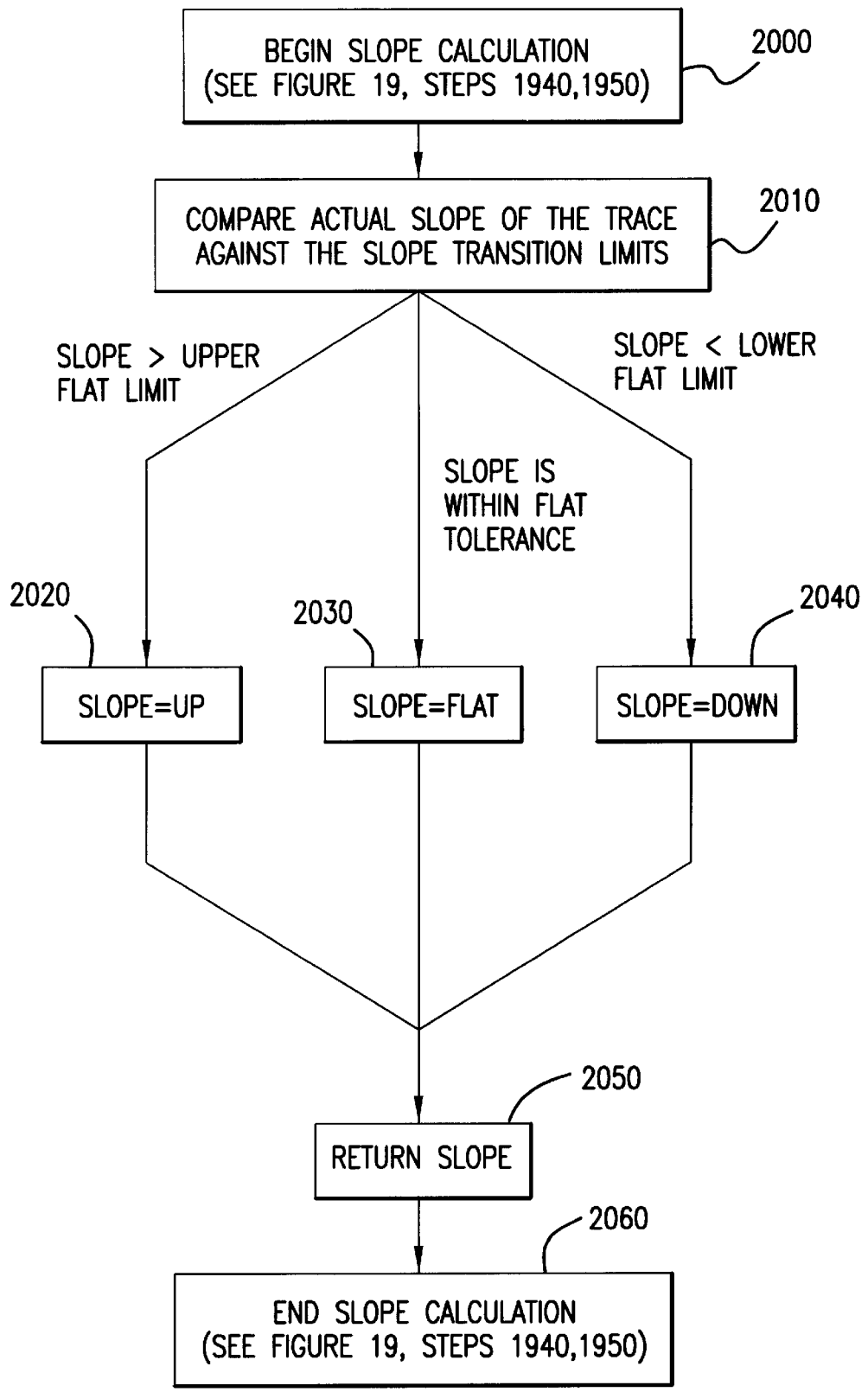
FIG. 20 is a flow chart of a slope calculation algorithm for the region matching method of FIG. 19.

FIG. 20 is a flow chart of a slope calculation algorithm for the region matching method of FIG. 19. The slope calculation begins at step 2000. In step 2010, the actual slope of the trace is compared against predetermined slope transition limits. For example, the slope transition limits define an upper limit of a slope to be considered FLAT and a lower limit of a slope to be considered FLAT. A slope above the upper FLAT limit is deemed an UP slope, as indicated at step 2020. A slope within the upper and lower FLAT limits is deemed flat, as indicated at step 2030. A slope below the lower FLAT limit is deemed a down slope, as indicated at step 2040. When the slope has been categorized as UP, FLAT or DOWN, the slope category is returned at step 2050 for use in subsequent comparison. The slope calculation ends at step 2060.

Figure 21:
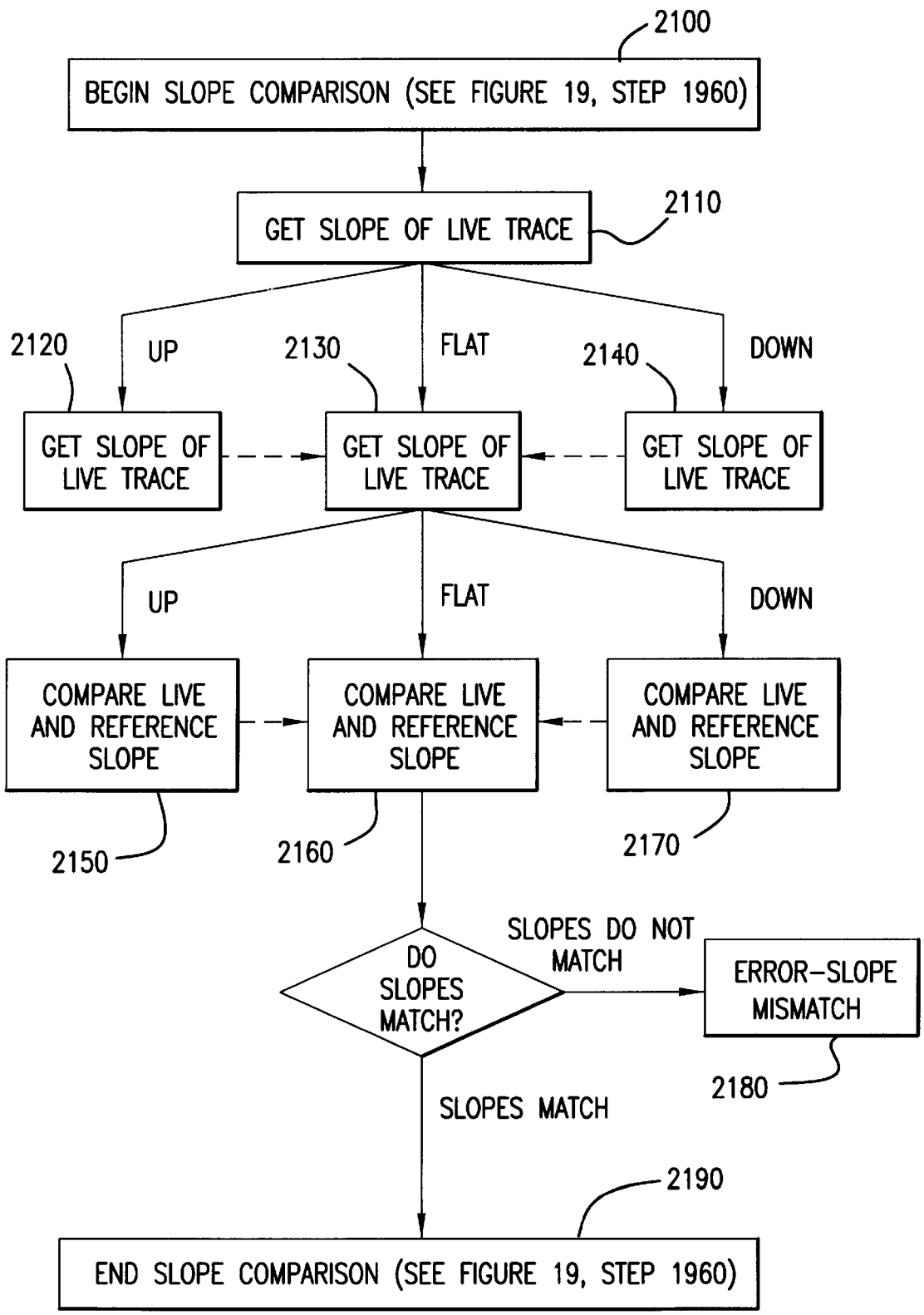
FIG. 21 is a flow chart of a slope comparison algorithm for the region matching method of FIG. 19.

FIG. 21 is a flow chart of a slope comparison algorithm for the region matching method of FIG. 19. The slope comparison begins at step 2100. In step 2110, the slope of the live end-point trace is obtained and is either UP as indicated at step 2120, FLAT as indicated at step 2130, or DOWN as indicated at step 2140. The slope of the live end-point trace is then compared against the slope of the reference trace, which is either UP, FLAT or DOWN at indicated respectively at steps 2150, 2160 and 2170. If the slopes do not match, an error message is generated at step 2180. If the slopes match (that is, both are UP, both are FLAT, or both are DOWN), then the slope comparison ends at step 2190.

Those of skill in the art will recognize that these and other modifications can be made within the spirit and scope of the invention as defined in the claims which follow.

We claim:

1. A method of processing a semiconductor device, comprising:
   a. applying a focused ion beam to a structure of a semiconductor device to be processed;
   b. producing a live detector signal by detecting secondary electrons emitted as the focused ion beam is applied to the structure; and
   c. comparing the live detector signal with a reference trace having a region indicative of an expected material boundary and a stop marker within said region; and
   d. terminating application of the focused ion beam to the structure of the semiconductor device when the live detector signal exhibits a characteristic corresponding to said region of the reference trace.

2. The method of claim 1, further comprising generating said reference trace by:
   e. applying a focused ion beam to a reference structure of a semiconductor device;
   f. producing a reference detector signal by detecting secondary electrons emitted as the focused ion beam is applied to the reference structure; and g. preparing from the reference signal a reference trace defining said region indicative of said expected material boundary and said stop marker within the region.

3. The method of claim 2, wherein step g. comprises normalizing the reference trace by compensating average contrast level.

4. The method of claim 1, wherein step b. comprises normalizing the live detector signal by compensating average contrast level.

5. The method of claim 2, wherein step g. comprises dividing the reference trace into slope regions.

6. The method of claim 5, wherein step g. further comprises defining as a stop region a region of the reference trace which represents a material boundary within the reference structure.

7. The method of claim 6, wherein step g. further comprises assigning a stop marker to the stop region.

8. The method of claim 1, wherein step c. comprises comparing slope of the live detector signal with slope of the reference trace.

9. The method of claim 1, further comprising the step of applying a gas to the structure as the focused ion beam is applied to the structure.

10. The method of claim 1, further comprising the step of terminating application of the gas to the structure when the live detector signal exhibits a characteristic corresponding to said region of the reference trace.

11. The method of claim 7, wherein step c. comprises: retrieving a reference trace (1810); determining whether the reference trace includes a stop region (1820); determining whether the comparison has passed the stop region (1830); and comparing slope of the live detector signal with slope of each region of the reference trace (1840).

12. The method of claim 11, wherein step c. further comprises determining when the stop region has been reached (1840) and, when reached, counting time from the beginning of the stop region until the stop marker is encountered.

13. The method of claim 12, wherein step d. comprises termination application of the focused ion beam to the structure after the stop marker is encountered.

14. The method of claim 11, wherein comparing slope of the live detector signal with slope of a region of the reference trace comprises: detecting when a region transition is encountered on the live detector signal (1930); calculating slope of a region just traversed on the live detector signal and designating as UP, FLAT or DOWN (1940); calculating slope of a region just traversed on the reference trace and designating as UP, FLAT or DOWN (1950); and determining whether the slope designation of the live detector signal matches the slope designation of the reference trace.

15. The method of claim 14, wherein calculating slope of a region comprises: assigning slope transition limits to define UP, FLAT and DOWN slope designations, and determining whether the slope of a region falls within, above or blow the slope transition limits.

16. A method of processing a semiconductor device, comprising:

a. applying a focused ion beam and a first gas to a structure of a semiconductor device to be processed;

b. producing a live detector signal by detecting secondary electrons emitted as the focused ion beam is applied to the structure; and c. comparing the live detector signal with a reference trace having a region indicative of an expected material boundary and a stop marker within said region; and d. when the live detector signal exhibits a characteristic corresponding to said region of the reference trace, applying a focused ion beam and a second gas to said structure.

* * * * *